(12) United States Patent
Lee et al.

(10) Patent No.: US 6,559,526 B2
(45) Date of Patent: May 6, 2003

(54) MULTIPLE-STEP INNER LEAD OF LEADFRAME

(75) Inventors: Jui-Chung Lee, Yun-Lin (TW);
Chen-Jung Tsai, Tainan (TW);
Chih-Wen Lin, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 35 days.

(21) Appl. No.: 09/842,133

(22) Filed: Apr. 26, 2001

(65) Prior Publication Data

US 2002/0158316 A1 Oct. 31, 2002

(51) Int. Cl.[7] .............................................. H01L 23/495
(52) U.S. Cl. .................... 257/676; 257/666; 257/668; 257/669; 257/686; 257/723; 257/724
(58) Field of Search ................................ 257/676, 666, 257/723, 668, 669, 686, 724

(56) References Cited

U.S. PATENT DOCUMENTS

| | | | |
|---|---|---|---|
| 4,987,473 A | | 1/1991 | Johnson |
| 5,291,061 A | | 3/1994 | Ball |
| 5,530,281 A | | 6/1996 | Groover et al. |
| 5,804,874 A | | 9/1998 | An et al. |
| 6,087,718 A | | 7/2000 | Cho |
| 6,087,722 A | * | 7/2000 | Lee et al. .................... 257/669 |
| 6,118,174 A | * | 9/2000 | Kim .......................... 257/666 |
| 6,118,176 A | | 9/2000 | Tao et al. |

* cited by examiner

Primary Examiner—Michael S. Lebentritt
Assistant Examiner—Douglas M Menz

(57) ABSTRACT

A structure of a stacked-type multi-chip stack package of the leadframe, the shape of the stair-like inner leads can be regulated for the high and the amount of stacked chips and to match different bonding technology. The process for forming the present structure can be easily performed by visible equipment and materials, and the present structure can raise the reliability of bonding process. The present invention can stack multi-chip (more than two).

14 Claims, 4 Drawing Sheets

MULTIPLE-STEP INNER LEAD OF LEADFRAME

BACKGROUND OF THE INVENTION

1. Field of the Invention

The present invention generally relates to a stacked-type multi-chip package, and more particularly relates to a stacked-type multi-chip package of a leadframe.

2. Description of the Prior Art

In the interest of higher performance equipment and lower cost, increased miniaturization of components and greater packaging density have been the most goals of the computer industry. The density of the IC package is primarily limited by the available area of die mounting and the total height of the IC package. An conventional method of increasing density is to stack die or chips vertically.

Referring to FIG. 1, a structure presented here is a conventional structure of a stacked-type multi-chip package. A chip 120 and a chip 130 are vertically stacked on a leadframe paddle 100 by using a adhesive film 150 and has a plurality of inner leads 102 around the leadframe paddle 100. A plurality of wires 122 and a plurality of wires 132 are connecting the active surface of the chip 120 and the active surface of the chip 130 to those inner leads 102.

U.S. Pat. No. 6,118,176 issued to ASE in 2000 discloses a structure of a stacked chip assembly, which stacks two chips. Chips are both on the same side of the leadframe die paddle. The inner-lead is step-like to use for bearing the body of stacked chips. U.S. Pat. No. 6,087,718 issued to LG Semicon in 2000 discloses a stacked-type semiconductor chip package. The major function of the inner lead is to bear the chip. U.S. Pat. No. 5,804,874 issued to Samsung in 1998 discloses a structure of a plurality of lead on chip type semiconductor chips. The major function of the inner lead is to bear the chip. U.S. Pat. No. 5,530,281 issued to VLSI in 1996 and U.S. Pat. No. 4,987,473 issued to VLSI in 1991 both disclose similar inner leads, which are in different planarity and stagger, can shorten the bonding wires and avoid wires crossing. U.S. Pat. No. 5,291,061 issued to Micron in 1994 discloses a structure of a multi-chip stacked die device. The upward inner leads in different planarity can shorten the wire bond length.

In the foregoing references, there are still many disadvantages need to overcome. For example, the design of the lead makes the process more difficult and different directions wires bonding process needs additional tooling cost and more process difficulty. Special layout on inner leadframe or on bond pad will raise the package cost and the process difficulty.

Current multi-chip stacked package of the leadframe has essentially two kinds of structures. One is stacking chips on both sides of the leadframe paddle and the active side of two chips is in contrary directions. This structure needs design a special bond pad for one chip and a reversal process. The process is complicated and not easily controlled. Furthermore, chips will be damaged easily in stacking processes and the process cost is higher. Another structure is stacking chips on one side of the leadframe paddle and active sides of chips are faced in same directions. This package can be useed standard product and they do not need special layout on chips. In the design rule of the leadframe of the stacked-type multi-chip package, the normal way is a slot leadframe combining using a special stacked structure or a stacked multiple inner leads of the leadframe. However, these structures are having many limitations and the process is complicated and difficult controlled.

SUMMARY OF THE INVENTION

The primary object of the invention is to improve the structure of the inner lead of the leadframe to reduce the difficulty of bonding and to raise the reliability of the stacked-type multi-chip package.

Another object of the invention is to provide a structure of a stacked-type multi-chip package of the leadframe which inner leads are designed as a stair-like shape.

A further object of the invention is to provide a stacked-type multi-chip package of a leadframe having stair-like inner leads to reduce the difficulty of bonding and to raise the reliability of the multi-chip stack package.

In order to achieve previous objects of the invention, a structure of a stacked-type multi-chip package of a leadframe comprises following essential elements is provided. A leadframe paddle and a plurality of upward stair-like leads are provided, wherein each of the stair-like leads has several steps. A first chip is mounted on the leadframe paddle, wherein an active surface of the first chip is opposed to the leadframe paddle. A plurality of first wires are connecting a first horizontal step of the stair-like leads to the active surface of the first chip, wherein the first horizontal step of the stair-like leads is nearest the leadframe paddle. A second chip is stacked on the first chip, wherein an active surface of the second chip is opposed to the leadframe paddle. A plurality of second wires are connecting the second horizontal step of the stair-like leads to the active surface of the second chip, wherein the second horizontal step of the stair-like leads is upward extended from the first horizontal step.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The embodiments illustrated herein are showed in two-dimensional views with various regions having width and depth, it should be clearly understood that these regions are illustrations of only a portion of a single cell of a device, which may include a plurality of such cells arranged in a three-dimensional structure.

In this invention, the structure of a stacked-type multi-chip package of a leadframe is provided, which the structure is designed the leadframe with stair-like inner leads. The shape of the stair-like inner leads can be regulated for the height and the amount of stacked chips. The structure of the present invention is vertically stacked chips and designed several types of the stair-like inner leads to match different bonding technology.

Figure 1:
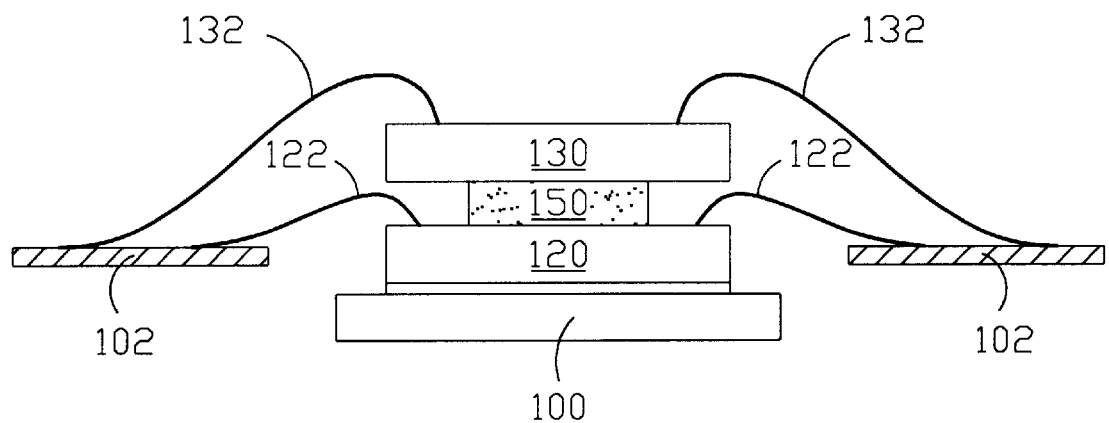
FIG. 1 shows a cross-sectional view of a structure of a stacked-type multi-chip package, in accordance with prior techniques.
Figure 2A:
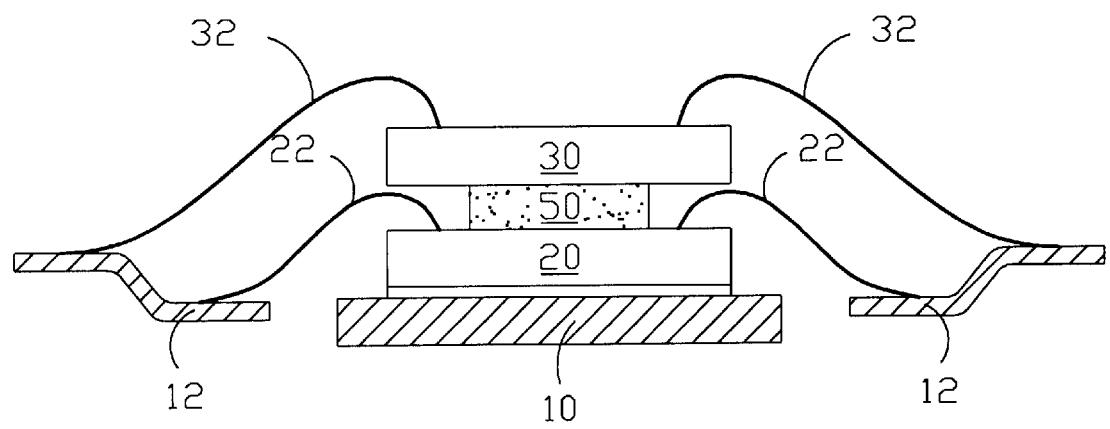
FIG. 2A to FIG. 2C show cross-sectional views of a structure of a stacked-type multi-chip package, in accordance with the present invention; and FIG. 3A to FIG. 3C shows cross-sectional views of a structure of a stacked-type multi-chip package, in accordance with the present invention.

Referring to FIG. 2A, there is an embodiment in the present invention. A first chip 20 and a second chip 30 are vertically stacked together on a leadframe paddle 10. An active surface of the first chip 20 and an active surface of the second chip 30 are faced up and opposed to the leadframe paddle 10. The first chip 20 and the second chip 30 are stacked by using a adhesive film 50. The structure may further comprise a adhesive layer to mount the first chip 20 on the leadframe paddle 10. A plurality of stair-like inner leads 12 are around the leadframe paddle 10. Each of the stair-like inner leads has a plurality of horizontal steps. For example, stair-like inner leads 12 have a first horizontal step and a second horizontal step, wherein the first horizontal step is nearest the leadframe paddle 10 and the second horizontal step is upward extended from the first horizontal step. Here, each included angle of a pair of horizontal steps of the stair-like inner leads 12 is greater than ninety degrees. A plurality of first wires 22 are connecting the first horizontal step of the inner leads 12 to the active surface of the first chip 20. A plurality of second wires 32 are connecting the second horizontal step of the inner leads 12 to the active surface of the second chip 30.

Figure 2B:
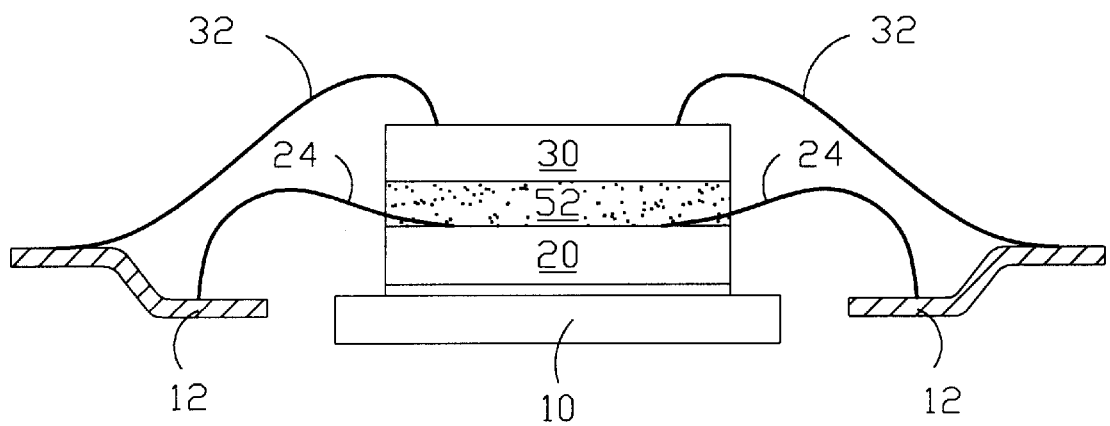
Figure 2C:
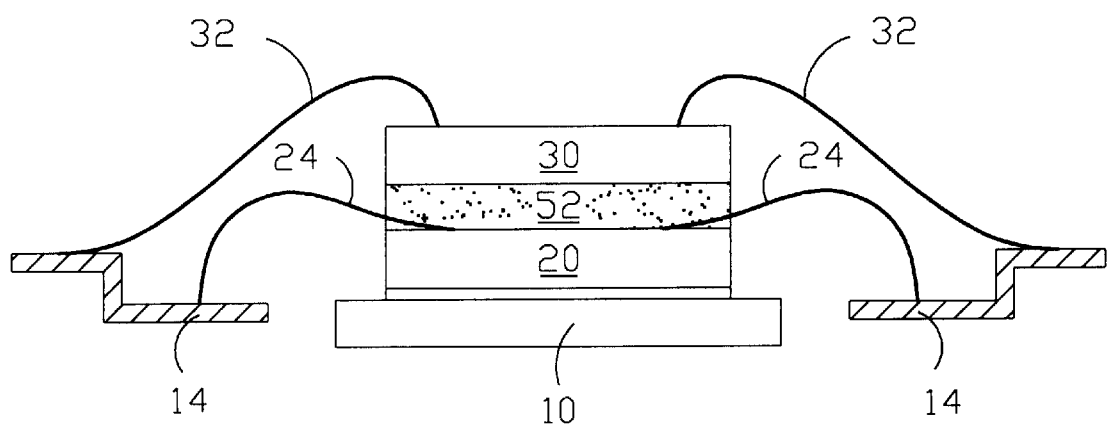

FIG. 2B and FIG. 2C are another embodiments in the present invention. Same emblems indicate same elements in different figures. In these embodiments, the first chip 20 and the second chip 30 can be stacked by using a liquid adhesive epoxy 52. Referring to FIG. 2C, in the stair-like inner leads 14, each included angle of a pair of horizontal steps of the stair-like inner leads 14 is ninety degrees or less. A plurality of first wires 24 are connecting the first horizontal step of the inner leads 14 to the active surface of the first chip 20.

Figure 3A:
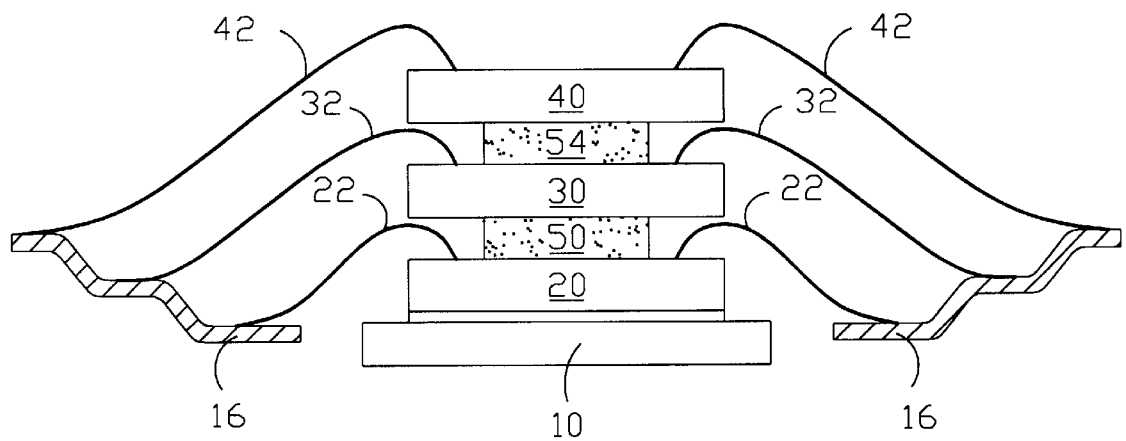

Referring to FIG. 3A, there is an embodiment for three chips stacked-type package or more than three chips. A third chip 40 is stacked on the second chip 30 by using a adhesive film 54 and an active surface of the third chip 40 is opposed to the leadframe paddle 10. A plurality of stair-like inner leads 16 are around the leadframe paddle 10 and those stair-like inner leads 16 have three horizontal steps (a first horizontal step, a second horizontal step, and a third horizontal step). The third horizontal step is upward extended from the second horizontal step. A plurality of third wires 42 are connecting the third horizontal step of inner leads 16 to an active surface of the third chip 40. In the stair-like inner leads 16, each included angle of a pair of horizontal steps of the stair-like inner leads 16 is greater than ninety degrees.

Figure 3B:
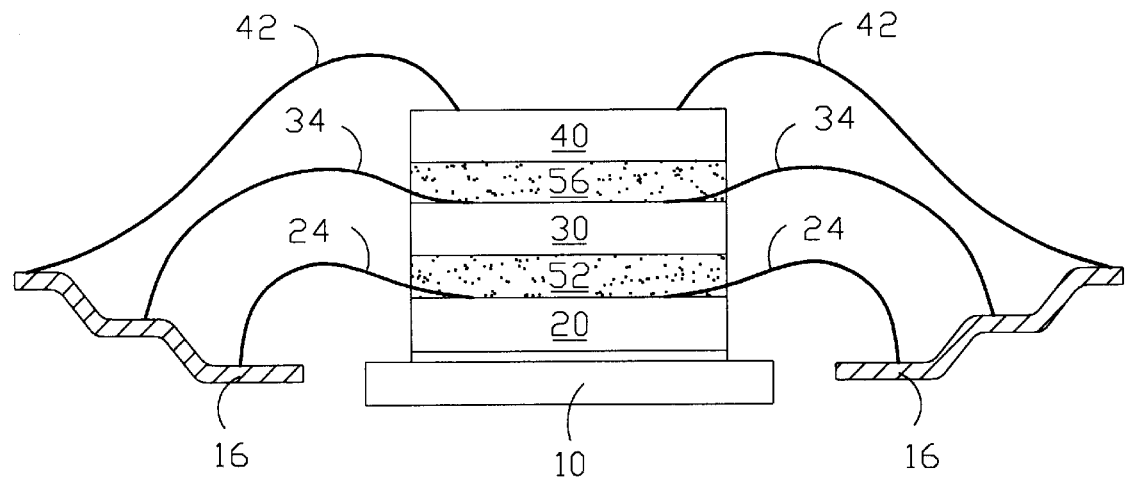
Figure 3C:
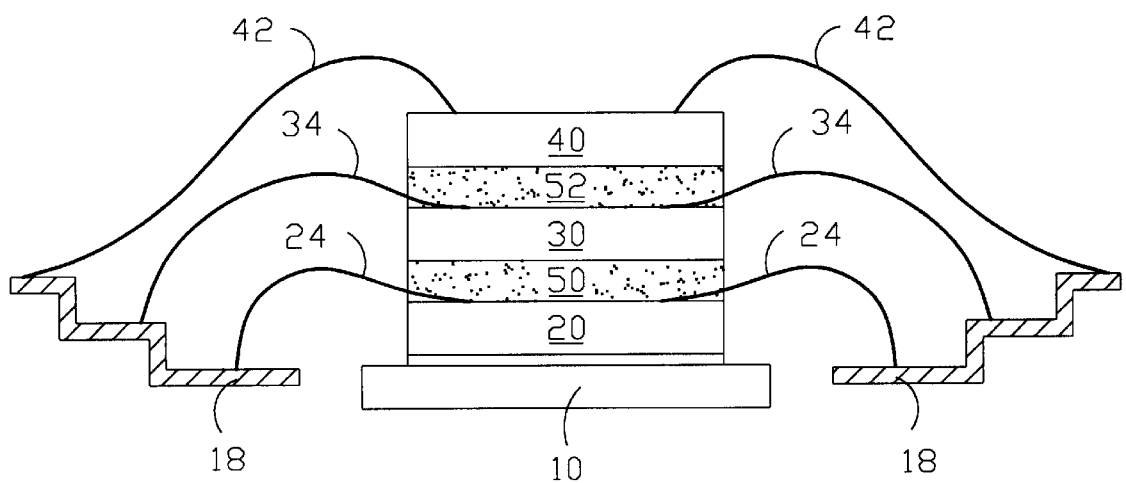

Referring to FIG. 3B and FIG. 3C, there are another embodiments for three chips stacked-type package or more than three chips. In these embodiments, the first chip 20, the second chip 30, and the third chip 40 are stacked one-by-one by using a liquid adhesive epoxy 52 and a liquid adhesive epoxy 56. Referring to FIG. 3C, in the stair-like inner leads 18, each included angle of a pair of horizontal steps of the stair-like inner leads 18 is ninety degrees or less.

In the design shape of stair-like inner leads of the present invention, the process of bonding wires can be selected from the group of a normal wire bonding technology and a reverse wire bonding technology. If each included angle of a pair of horizontal steps of the stair-like inner leads 12 is greater than ninety degrees, it can fit for using a normal wire bonding technology or a reverse wire bonding technology and can raise the reliability of wire bonding processes. If each included angle of a pair of horizontal steps of the stair-like inner leads is less than or equal to ninety degrees, it still can apply for a reverse wire bonding technology. The stair-like inner leads of the present invention can adequately change to fit the choice of the wire bonding technology and the height and the amount of stacked chips.

The present invention effectively improves disadvantages of a conventional stacked-type multi-chip package. The manufacture of the stair-like inner leads of the leadframe only needs a one-step forming process or a multi-steps forming process to reprocess original leads of the leadframe. The manufacture of the structure of multi-chip stack package can use same processes and equipment of single chip package. The design structure of stair-like inner leads can optimise the structure of the wires and avoid wires crossing. The stair-like inner leads of the present invention can adequately change to fit the choice of the wire bonding technology and to raise the reliability of the wire bonding process. The present invention can still provide to stack more than three chips.

To sum of the forgoing, the present invention provided a structure for stacked-type multi-chip package of a leadframe. In the structure, all active surface of chips is faced same direction and all chips are on the same side of the leadframe paddle. Each of the inner leads is serial-stair-like and can be made by a one-step forming process or a multi-step forming process. The shape of stair-like inner leads has two types, which one has an included angle greater than ninety degrees and another has an included angle a little less than ninety degrees. The stair-like inner leads can apply for using a normal wire bonding technology or a reverse wire bonding technology. The structure of the present invention can use a adhesive film or a liquid adhesive epoxy to adhere and stack chips. The present invention can apply for stacking same or different size chips and for stacking same or different functional chips. Furthermore, the structure can apply for stacking more than three chips.

Of course, it is to be understood that the invention need not be limited to these disclosed embodiments. Various modification and similar changes are still possible within the spirit of this invention. In this way, the scope of this invention should be defined by the appended claims.

What is claimed is:

1. A stacked-type multi-chip package of a leadframe comprising:
   a leadframe paddle;
   a plurality of upward stair-like leads around said leadframe paddle, wherein each of said stair-like leads has several steps, and each included angle of a pair of horizontal steps of said stair-like leads is a little less than ninety degrees;
   a first chip mounted on said leadframe paddle, wherein an active surface of said first chip is opposed to said leadframe paddle;
   a plurality of first wires connecting a first horizontal step of said stair-like leads to said active surface of said first chip, wherein said first horizontal step of said stair-like leads is nearest said leadframe paddle;
   a second chip stacked on said first chip, wherein an active surface of said second chip is opposed to said leadframe paddle; and
   a plurality of second wires connecting said second horizontal step of said stair-like leads to said active surface of said second chip, wherein said second horizontal step of said stair-like leads is upward extended from said first horizontal step.

2. The stacked-type multi-chip package according to claim 1, further comprising an adhesive layer to mount said first chip on said leadframe paddle.

3. The stacked-type multi-chip package according to claim 1, further comprising an adhesive layer to stack said second chip on said first chip.

4. The stacked-type multi-chip package according to claim 3, wherein said adhesive layer is selected from the group of a adhesive film and a liquid adhesive epoxy.

5. The stacked-type multi-chip package according to claim 1, further comprising a third chip stacked on said second chip.

6. The stacked-type multi-chip package according to claim 5, wherein an active surface of said third chip is opposed to said leadframe paddle.

7. The stacked-type multi-chip package according to claim 5, further comprising an adhesive layer to stack said third chip on said second chip.

8. The stacked-type multi-chip package according to claim 7, wherein said adhesive layer is selected form the group of a adhesive film and a liquid adhesive epoxy.

9. A stacked-type multi-chip package of a leadframe comprising:

a leadframe paddle;

a plurality of upward stair-like leads around said leadframe paddle, wherein each of said stair-like leads has several steps, and each included angle of a pair of horizontal steps of said stair-like leads is a little less than ninety degrees;

a first chip mounted on said leadframe paddle, wherein an active surface of said first chip is opposed to said leadframe paddle;

a plurality of first wires connecting a first horizontal step of said stair-like leads to said active surface of said first chip, wherein said first horizontal step of said stair-like leads is nearest said leadframe paddle;

a second chip stacked on said first chip, wherein an active surface of said second chip is opposed to said leadframe paddle;

a plurality of second wires connecting said second horizontal step of said stair-like leads to said active surface of said second chip, wherein said second horizontal step of said stair-like leads is upward extended from said first horizontal step;

a third chip stacked on said second chip, wherein an active surface of said third chip is opposed to said leadframe paddle; and a plurality of third wires connecting said third horizontal step of said stair-like leads to said active surface of said third chip, wherein said third horizontal step of said stair-like leads is upward extended from said second horizontal step.

10. The stacked-type multi-chip package according to claim 9, further comprising an adhesive layer to mount said first chip on said leadframe paddle.

11. The stacked-type multi-chip package according to claim 9, further comprising an adhesive to stack said second chip on said first chip.

12. The stacked-type multi-chip package according to claim 11, where in said adhesive layer is selected from the group of a adhesive film and a liquid adhesive epoxy.

13. The stacked-type multi-chip package according to claim 9, further comprising an adhesive layer to stack said third chip on said second chip.

14. The stacked-type multi-chip package according to claim 13, wherein said adhesive layer is selected from the group of a adhesive film and a liquid adhesive epoxy.

* * * * *